(12) United States Patent
Sharpe-Geisler et al.

(10) Patent No.: US 9,252,755 B1
(45) Date of Patent: Feb. 2, 2016

(54) SHARED LOGIC FOR MULTIPLE REGISTERS WITH ASYNCHRONOUS INITIALIZATION

(71) Applicant: Lattice Semiconductor Corporation, Hillsboro, OR (US)

(72) Inventors: Brad Sharpe-Geisler, San Jose, CA (US); Ting Yew, San Jose, CA (US); Senani Gunaratna, Los Gatos, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/611,095

(22) Filed: Jan. 30, 2015

Related U.S. Application Data

(60) Provisional application No. 62/028,441, filed on Jul. 24, 2014.

(51) Int. Cl.
*H03K 3/289* (2006.01)
*H03K 3/3562* (2006.01)
*H03K 19/00* (2006.01)
*H03K 19/173* (2006.01)

(52) U.S. Cl.
CPC ........ *H03K 3/35625* (2013.01); *H03K 19/0016* (2013.01); *H03K 19/173* (2013.01)

(58) Field of Classification Search
CPC .................. H03K 19/17736; H03K 19/1774; H03K 19/0016; H03K 19/173; H03K 3/289; H03K 3/35625
USPC .............................. 326/40, 46; 327/202, 203
See application file for complete search history.

(56) References Cited

U.S. PATENT DOCUMENTS

| | | | |
|---|---|---|---|
| 6,703,862 B1 | 3/2004 | Bilski | |
| 7,256,612 B1 * | 8/2007 | Young | H03K 19/17728 326/37 |
| 7,420,390 B1 | 9/2008 | Hutton et al. | |
| 2014/0210511 A1 * | 7/2014 | Bartling | H03K 19/173 326/38 |

* cited by examiner

*Primary Examiner* — Daniel D Chang

(57) ABSTRACT

A control circuit is provided that enables a register to provide a synchronous initialization capability as well as an asynchronous capability despite the register having no asynchronous input.

20 Claims, 4 Drawing Sheets

SHARED LOGIC FOR MULTIPLE REGISTERS WITH ASYNCHRONOUS INITIALIZATION

RELATED APPLICATIONS

This application claims the benefit of U.S. Provisional Application No. 62/028,441, filed Jul. 24, 2014, the contents of which are incorporated by reference herein in their entirety.

TECHNICAL FIELD

The present invention relates generally to registers, and more particularly to a control circuit and a corresponding array of registers that receive a gated clock and control signals from the control circuit.

BACKGROUND

The die area demands for registers depends upon their complexity. If the register is relatively simple, it may be constructed with fewer transistors and thus demands less die space. On the other hand, a user may require greater functionality from a register such as a clock enable (CE), a synchronous set/reset, and an asynchronous set/reset capability. It is conventional to provide such a rich set of functionality to a register using a relatively large number of transistors. But the resulting design then suffers from loss of density. In addition, a conventional register implements a clock enable function by recycling its registered output signal as an input signal that is then registered responsive to the clock. The register is thus cycling according to the clock even when the clock enable signal is de-asserted, which wastes power.

Accordingly, there is a need in the art for more robust register architectures that provides a full set of controls with increased density and low power consumption.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1B:
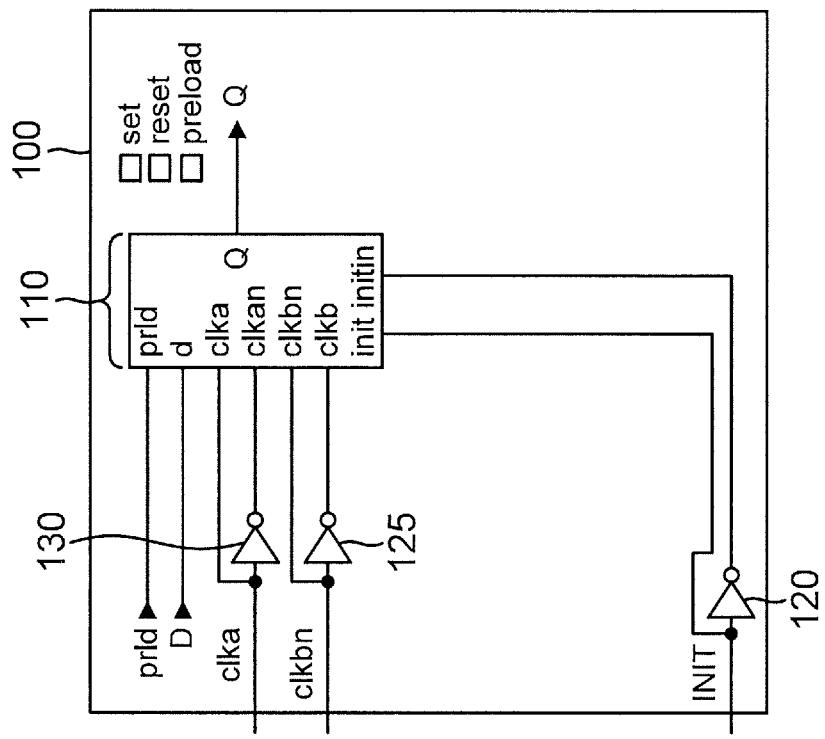
FIG. 1B is a block diagram of a register from the array of registers in FIG. 1A.

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

To increase density, a control circuit is provided that drives a set of control signals to a group of registers. The control signals are thus shared by the corresponding group of registers. In this fashion, the die area demands for the control circuit are amortized across the group of registers. Each register may thus be simplified and demand less die area so that despite the die area demand for the control circuit, the overall density of the system formed by the control circuit and the corresponding group of registers is improved as compared to conventional register architectures.

With regard to its functionality, each register is configured to have only a synchronous set/reset capability. There is thus no clock enable input to the registers nor do the registers include an asynchronous set/reset control signal input. Each register includes a master latch and a slave latch. The master latch is deemed to be a "master" as it resides between the register's data input and the slave latch. The slave latch can thus only latch an output signal from the corresponding master latch. In contrast, the master latch may latch the data input signal to the register so as to then provide an output signal to its slave latch. Responsive to receiving a system clock input, the control circuit provides a master clock to the registers and a slave clock. To advantageously save power, the control circuit implements the clock enable function by gating the master clock and the slave clock responsive to receiving a de-asserted clock enable signal.

When the clock enable signal is de-asserted, the control signal prevents the master and slave clocks from cycling so that the registers do not waste power. In contrast, a conventional clock-enabled register is configured to implement the clock enable function by recycling its registered output signal as a data input signal that is re-registered responsive to the master and slave clocks. The resulting switching on and off of transmission gates in the conventional clock-enabled register consumes power that is conserved in the registers disclosed herein. In contrast, the registers disclosed herein do not waste power as their master and slave clocks are gated by the control circuit in response to a de-assertion of the clock enable signal.

The control circuit produces a dual-mode initialization signal in response to receiving an input initialization signal. As used herein, "initialization" is a generic term to refer to either a set or reset operation on the associated registers. Whether a register performs a set or reset in an initialization operation will be explained further herein. The control circuit is configurable such as in response to a configuration bit signal so that the dual-mode initialization signal corresponds to either a synchronous initialization signal or an asynchronous initialization signal. Should the control circuit be configured for synchronous initialization such that the dual-mode initialization signal corresponds to a synchronous initialization signal, the control circuit continues to allow the master and slave clocks to cycle responsive to cycles of the system clock. Depending upon whether the registers are configured to be set or reset in response to the assertion of the dual-mode initialization signal, the registers would then set or rest responsive to the master and slave clock cycles. In that regard, the master latch is set (or reset) in a first half of a system clock period and the slave latch set (or reset) in the second half of the system clock period. Such resetting or setting is akin to the registration of a data bit in that such registration also occurs in the master latch first, followed by the slave latch. In other word, the master clock cycles low so that the master latch is transparent. At this time, the slave clock cycles high so that the slave latch is closed. The master clock then cycles high while the slave clock cycles low. The master latch then closes while the slave latch opens to latch whatever bit was latched by the master latch when the master latch was transparent (open).

But such master-followed-by-slave registration does not occur in an asynchronous initialization because, by definition, an asynchronous initialization of a register has no relationship to the master clock or to the slave clock. But as discussed previously, the registers associated with the control circuit have only a synchronous initialization capability. This is advantageous as the registers are thus relatively simple and demand less die space. But the user may need an asynchronous initialization capability. To fulfill this need while advantageously conserving die space, the control circuit (in an asynchronous initialization mode) "fools" the synchronous register by asynchronously asserting the master and slave clocks responsive to an assertion of the input initialization signal. In other words, at the same time that the control circuit asserts the dual-mode initialization signal in response to an assertion of the input initialization signal, it asserts both the master and the slave clock so that both the master and slave latch are opened. The registers will thus asynchronously set or reset (depending upon their configuration) in response to an assertion of the dual-mode initialization signal when the control circuit is configured for asynchronous initialization. In addition, the control circuit is configured to "override" the clock enable signal if the initialization signal is asserted in the asynchronous or synchronous mode of operation. For example, suppose that the clock enable signal is de-asserted but that the input initialization signal is asserted when the control circuit is configured for synchronous initialization. The control circuit will then cycle the master and slave clocks despite the clock enable signal being de-asserted. Similarly, the control circuit will assert both the master clock and the slave clock in response to the input initialization signal being asserted while the control circuit is configured for asynchronous initialization even though the clock enable signal is de-asserted.

As used herein, the master clock and the slave clock are said to be "asserted" when they are in a binary state that opens the corresponding master or slave latch. In the following embodiments, such a binary state is a logic low state (ground). But in alternative embodiments, the master and slave latches could be configured to be transparent in response to a logic high state (the power rail voltage) for the corresponding master/slave clock from the control circuit. Similarly, the clock enable signal is deemed to be "asserted" when it is in the binary state that triggers enabling the master and slave clocks. The following discussion is directed to embodiments in which such a binary state is a logic high state but alternative embodiments may be configured to trigger a clock enabling in response to a logic low state. Moreover, the initialization input signal and the dual-mode initialization signals are also deemed to be "asserted" when they are in the binary state corresponding to a triggering of an initialization of the registers. The following discussion will also assume that this binary state corresponds to a logic high state but alternative embodiments may be constructed in which the logic low state would signify an assertion of the input initialization and dual-mode initialization signals.

Figure 1A:
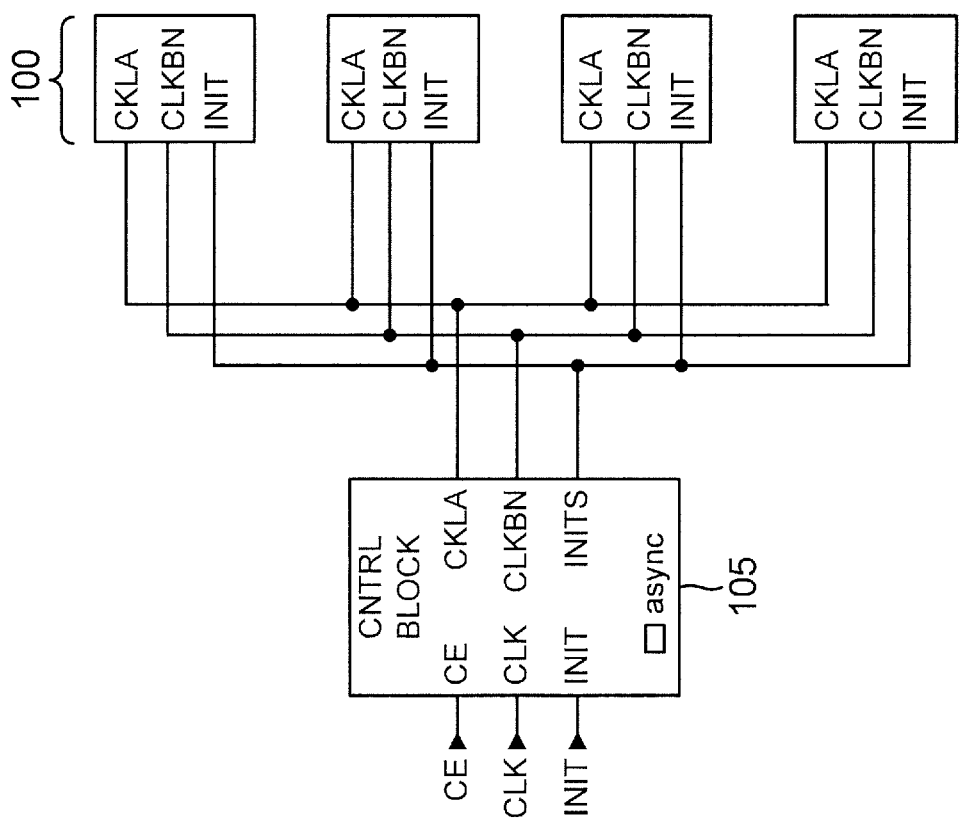
FIG. 1A illustrates a control circuit and a corresponding array of registers in accordance with an embodiment of the disclosure.

Turning now to the drawings, an example control circuit 105 and corresponding registers 100 are shown in FIG. 1A. As noted above, each register 100 does not have a clock enable signal input nor does it have an asynchronous initialization input. But both the clock enable function and the asynchronous initialization functions may occur through the control signals each register 100 does receive from control circuit 105: a master clock (CLKA), a slave clock (CLKBN), and a dual-mode initialization signal (INITS). Control circuit 105 produces these output signals responsive to a clock enable signal (CE), a system clock (CLK), and an input initialization signal (INIT). As shown in FIG. 1B, each register 100 includes an inverter 130 that inverts the master clock into an complement master clock (clkan). A register core 110 thus receives both the master clock and the complement master clock. Similarly, register 100 also includes an inverter 125 that inverts the slave clock into a complement slave clock (clkb). Register core 110 thus receives both the slave clock and the complement slave clock. Finally, register 100 also includes an inverter 120 for inverting the dual-mode initialization signal from control circuit 105 into a complement dual-mode initialization signal (initn). Register core 110 thus receives both the dual-mode initialization signal and its complement. It will be appreciated that the outputs of inverters 130, 125, and 120 may be shared by more than one register core 110 to increase density.

Figure 2:
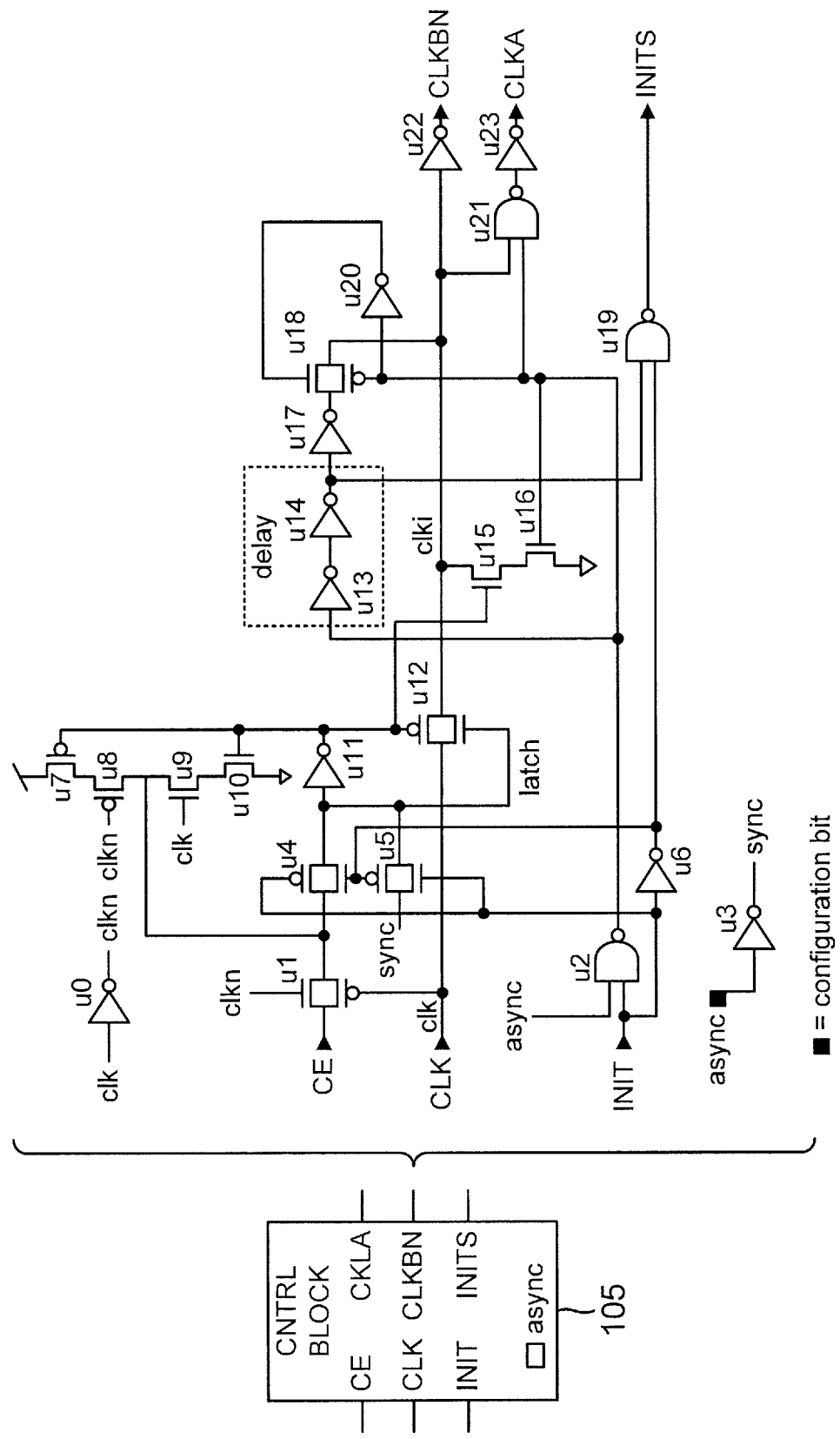
FIG. 2 is a circuit diagram for the control circuit of FIG. 1A.

A more detailed circuit diagram for control circuit 105 is shown in FIG. 2. Control circuit 105 is configured to respond to a configuration signal (async). If control circuit 105 is contained in a programmable logic device such as a field programmable gate array (FPGA), async could then be configured through a corresponding bit in the configuration data used to configure the device. Control circuit 105 includes an inverter u3 that inverts the asynch configuration signal to produce a synchronous (sync) signal. If the asynch signal is grounded (logic low), control circuit 105 is thus configured for synchronous initialization should the input initialization signal be asserted since the sync signal will be logic high. Alternatively, if the asynch signal is asserted to a logic high state and the input initialization signal is asserted, control circuit 105 is configured for asynchronous initialization.

Suppose that the input initialization signal is not asserted while the clock enable signal is asserted. The clock enable signal is received at a transmission gate u1 that is controlled by the system clock to switch on when the system clock is low. In that regard, control circuit 105 includes an inverter u0 that inverts the system clock to produce an inverted system clock (clkn) that also controls transmission gate u1. An inverter u6 inverts the low state for the input initialization signal (init) to produce an inverted version of the input initialization signal that, with the de-asserted input initialization signal switches on a transmission gate u4. The clock enable signal can then pass through transmission gates u1 and u4 to enter a sense enable latch formed by cross-coupled inverter u11 and a divided inverter formed by a PMOS transistor u7 and an NMOS transistor u10. This divided inverter for the sense enable latch is off when the system clock is low because the system clock drives a gate of an NMOS transistor u9 that couples between ground and the NMOS transistor u10. Similarly, a PMOS transistor u8 having its gate controlled by the inverted system clock couples to PMOS transistor u7. In this fashion, the sense enable latch is transparent (open) when the system clock is low and closed when the system clock cycles high (to a voltage for a power supply rail). Inverter u11 in the sense enable latch inverts the latched sense enable signal that together with the clock enable signal controls a transmission gate u12 coupling the system clock to an internal clock node (clki). At the same time, the low state for the input initialization signal forces an output signal from a NAND gate u2 high, which in turn switches on an NMOS transistor u16 and turns off a transmission gate u18 in conjunction with the action of an inverter u20. Although transistor u16 is on, it cannot discharge the internal clock node clki to ground because of an intervening NMOS transistor u15 that is switched off by the low output from inverter u11. The high output from NAND gate u2 causes another NAND gate u21 to act as an inverter and invert the system clock carried on the clki node. The NAND gate u21 output signal is in turn inverted by another inverter u23 to form the master clock (clkA). The slave clock (clkbn) is 180 degrees out of phase with the master clock at this time due to an inversion by an inverter u22 of the system clock carried by the clki node.

The sense enable latch latches whatever state the clock enable signal is in just prior to the system clock going high. If the clock enable signal was low at that time, the transmission gate u12 would thus shut off while transistor u15 is switched on so that the internal clock node clki is grounded through transistors u15 and u16. The master clock would then be forced low and the slave clock driven high such that the master and slave clocks would be prevented from cycling responsive to cycling of the system clock. If the clock enable signal were then asserted, it would be latched at the next rising edge of the clock.

With the input initialization signal low, the high output signal from inverter u6 forces a NAND gate u19 to act as an inverter with regard to an output of a delay chain formed by a serial combination of an inverter u13 and u14. The delay chain delays the high output signal from NAND gate u2 such that the output from the delay chain will eventually be driven high. Since both inputs to NAND gate u19 are high at this time, its output signal goes low. It is this output from NAND gate u19 that forms the dual-mode initialization signal (INITS) for the registers 100 of FIG. 1a. Thus, when the input initialization signal is low, the dual-mode initialization signal will also be low. The resulting impact on an example register core 110 may be understood in more detail with reference to the circuit diagram of FIG. 3. The low state for the dual-mode initialization signal along with the corresponding high state for the inverted dual-mode initialization signal (initn) switches on a transmission gate 320 to allow a data input signal d to propagate to a transmission gate 325 that is configured to switch on when the master clock (clka) is low. The master latch is formed by a cross-coupled inverter 330 and a divided inverter formed by PMOS transistor 350 and an NMOS transistor 335. PMOS transistor 350 couples to NMOS transistor 335 through a PMOS transistor 345 having its gate controlled by the inverted master clock and through an NMOS transistor 340 having its gate controlled by the master clock. The master latch will thus be open (transparent) while the master clock is low and closed while the master clock is high.

The slave latch is formed by a cross-coupled inverter 360 and a divided inverter formed by a PMOS transistor 370 and an NMOS transistor 385. PMOS transistor 370 couples to NMOS transistor 385 through a serial combination of a PMOS transistor 375 having its gate controlled by the inverted slave clock (clkb) and an NMOS transistor 380 having its gate controlled by the slave clock (clkbn). The latched output from the master latch (the output from inverter 330) couples to the input of the slave latch through a transmission gate 355 configured to switch on while the slave clock is low. The slave latch is thus open while the slave clock is low. Conversely, the slave latch is closed while the slave clock is high. As discussed earlier with regard to control circuit 105, the master clock is in phase with the system clock whereas the slave clock is 180 degrees out of phase with the system clock while the clock enable signal is asserted and the input initialization signal is low. When the system clock goes low, the master latch would then receive the data input, which in turn is latched by the slave latch when the system clock cycles high. Conversely, if the clock enable and the input initialization signal are both de-asserted, the master latch is forced open while the slave latch is closed so as to retain its previous state. At the same time, the transmission gate 320 is off in latch core 110 to prevent any change in the master latch state. The static state of the master and slave clocks while the clock enable signal is low (de-asserted) is quite advantageous in saving power in register 100. In addition, register 100 effects a clock enable function despite not having a clock enable input, which increases density.

Referring again to FIG. 2, an assertion of the input initialization signal drives the output of inverter u6 low and forces NAND gate u2 to act as in inverter with regard to the async configuration signal input. The output of NAND gate u2 will then be equal the sync signal. Should control circuit 105 be configured for synchronous initialization such that the sync signal is logic high, transistor U16 is switched on while transmission gate 18 is off. The high output from NAND gate u2 then propagates through the delay chain formed by inverters u13 and u14 to eventually drive an input of NAND gate u19 high. But the high value for the input initialization signal results in inverter u6 driving a logic low output to NAND gate u19, which in turn then drives its output signal high regardless of the delay chain output. An assertion of the input initialization signal thus results in the dual-mode initialization signal being asserted. But the state of the clock enable signal becomes irrelevant with the input initialization signal being high since transmission gate u4 is switched off. At the same time, a transmission gate u5 is switched on to allow the asserted sync signal to switch on transmission gate u12. In turn, the system clock can then drive the internal clock node clki. This node is not discharged because inverter u11 inverts the asserted sync signal to switch off transistor u15. The master and slave clocks then cycle responsive to the system clock as discussed with regard to the clock enable mode.

Figure 3:
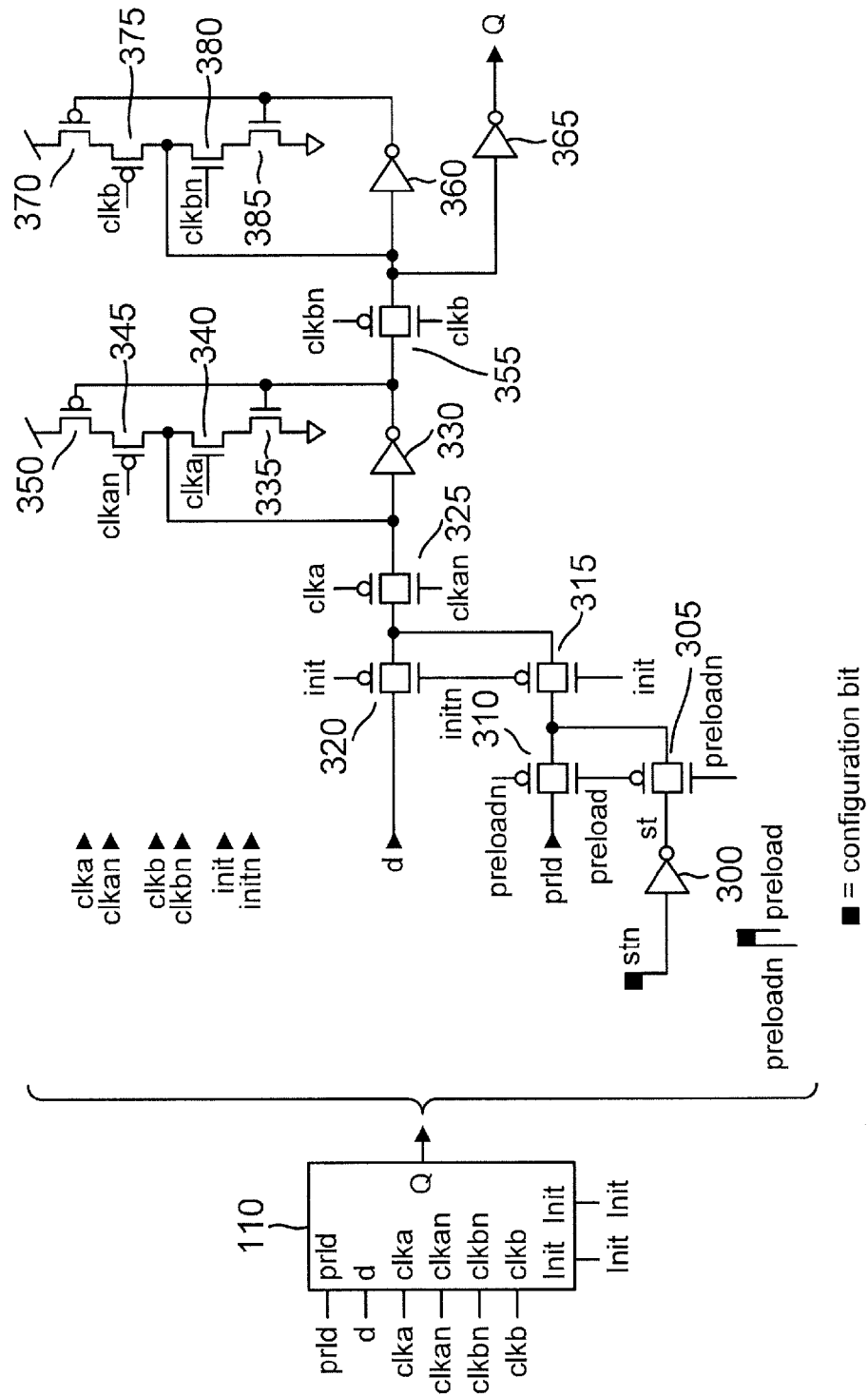
FIG. 3 is a circuit diagram for the register of FIG. 1B.

As shown in FIG. 3, transmission gate 320 of register core 110 switches off in response to the dual-mode initialization signal going high, which blocks the data input signal from passing though transmission gate 320. Register core 110 is configurable to respond to the dual-mode initialization signal responsive to a preload configuration signal (preload) that is inverted by an inverter (not illustrated) to form a complement preload configuration signal preload. Should the preload configuration signal be asserted, a transmission gate 310 switches on to allow the preload signal (prld) to pass to a transmission gate 315 that in turn is switched on by the assertion of the dual-mode initialization signal. The preload signal then propagates to the transmission gate 325 that is switched on when the master clock is low. The preload signal is then latched in the master and slave latches as discussed with regard to the latching of the data input signal in the clock enable mode. Should the preload signal be logic high while the dual-mode initialization signal is asserted, register 100 is thus set. Conversely, register 100 is reset when the preload signal is logic low and the dual-mode initialization signal is asserted. Should the preload configuration signal be low in a synchronous initialization operation, transmission gate 310 switches off while a transmission gate 305 switches on. A configuration signal stn gets inverted by an inverter 300 to form an initialization signal st that then propagates through transmission gate 315 to either set or reset the latches accordingly. In a programmable logic embodiment, the preload signal may be a dynamic signal created during operation of the programmable logic device whereas the configuration signal stn and the preload configuration signal could instead be programmed during configuration and thus remain static during operation.

Referring again to FIG. 2, asynchronous initialization occurs when the input initialization signal is high and the async configuration signal is also high. The output signal from NAND gate u2 will then go low, which shuts off transistor u16 and switches on transmission gate u18. The low value for the output from NAND gate u2 will then propagate through the delay chain and be inverted by an inverter u17 to drive the internal clock node clki high. The slave clock will thus be driven low. The low value for the output from NAND gate u2 also forces the output of NAND gate u21 high so that the master clock is driven low. As shown in FIG. 3, the master latch and the slave latch are then forced open responsive to this asynchronous grounding of the master and slave clocks. Whether register 100 is then set or reset depends upon the states of the preload configuration signal, the preload signal, and the configuration signal stn as discussed with regard to synchronous initialization. Referring again to FIG. 2, note that prior to the output from NAND gate u2 going low, it was high so that the input to inverter u17 and to NAND gate u19 was high. Inverter u17 will thus initially drive the input signal to transmission gate u18 low, which in turn drives internal clock node clki low. The slave clock will thus be initially driven high and then low in asynchronous operation. The delay chain formed by inverters u13 and u14 thus forces the slave clock to transition low after the dual-mode initialization signal is driven high in asynchronous operation. This is quite advantageous as it eliminates a race condition that could otherwise exist in register 100. In particular, note that the slave latch's transmission gate 355 should only switch on after the input to transmission gate 315 can propagate to transmission gate 355 as otherwise a glitch could occur. The delay chain in control circuit 105 prevents any such glitch from occurring.

Figure 4:
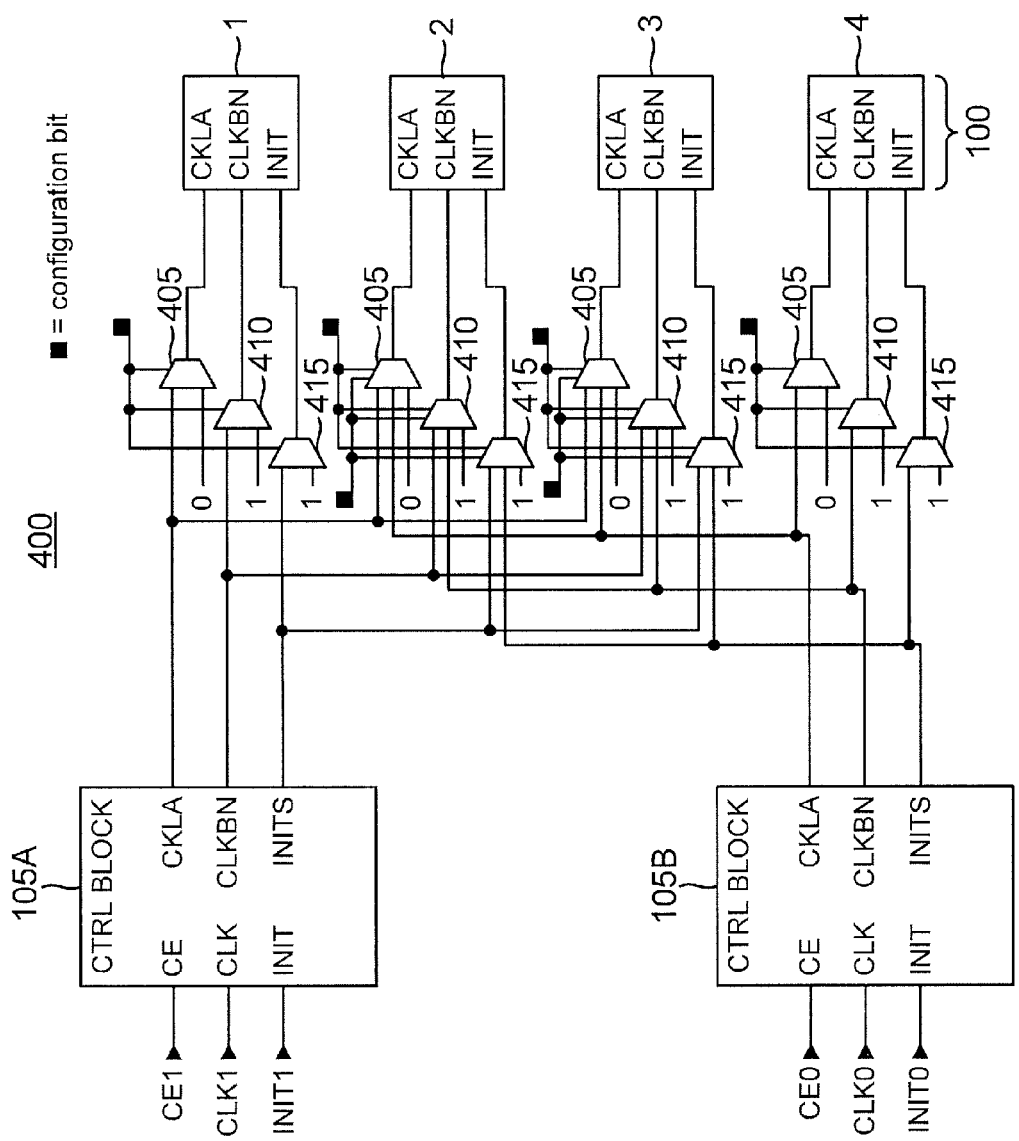
FIG. 4 is a block diagram of a multiplexed system of control circuits and corresponding registers in accordance with an embodiment of the disclosure.

The control outputs from a plurality of control circuits may be multiplexed to control the same group of registers. An example multiplexed system 400 for a pair of control circuits 105A and 105B and a corresponding register 1, a register 2, a register 3, and a register 4 is shown in FIG. 4. Registers 1 through 3 may be driven the control signals from control circuit 105A. Similarly, registers 2 through 4 may be driven by the control signals from control circuit 105B. To provide for this selectability, each register receives its master clock input through a corresponding multiplexer 405. Similarly, each register receives a slave clock input through a corresponding multiplexer 410. Finally, each register receives its dual-mode initialization signal from a corresponding multiplexer 415. Since registers 2 and 3 can select for the control signals from either control circuit 105A and 105B, their multiplexers 405, 410, and 415 receive both sets of control signals. To save power should a register not be used, each multiplexer 405, 410, and 415 may also select for a default input signal that is either a binary one or zero. Each control circuit 105 produces its own master clock, slave clock, and dual-mode initialization signal responsive to a receipt of its own clock enable signal, an input initialization signal, and a system clock as discussed with regard to FIG. 2. Another set of multiplexers (not illustrated) may select for the input signals to the control circuits 105A and 105B. The selectability of the control signals to registers 1 through 4 is particularly advantageous in a programmable logic embodiment such as in an FPGA where the data path width is adjustable.

It will be appreciated that the techniques and concepts discussed herein are not limited to the specific disclosed embodiments. The appended claims encompass all such changes and modifications as fall within the true spirit and scope of this invention.

We claim:

1. A system, comprising:
a control circuit configured to assert a dual-mode initialization signal in response to an assertion of an input initialization signal, the control circuit being further configured to respond to an assertion of a synchronous initialization signal while the input initialization signal is asserted by cycling a master clock and a slave clock responsive to a system clock and to respond to an assertion of an asynchronous initialization signal while the input initialization signal is asserted by asserting both the slave clock and the master clock asynchronously with regard to the system clock; and
a register including a master latch in series with a slave latch, the master latch being configured to open responsive to an assertion of the master clock and the slave latch being configured to open responsive to an assertion of the slave clock, the register including a first input transmission gate to the master latch configured to switch on in response to an assertion of the dual-mode initialization signal.

2. The system of claim 1, wherein the register further includes a second input transmission gate to the master latch that is configured to switch on in response to a de-assertion of the dual-mode initialization signal.

3. The system of claim 1, wherein the register is configured to provide a selected one of a preload signal and a set signal to the first input transmission gate.

4. The system of claim 3, wherein the system is incorporated into a programmable logic device, and wherein the preload signal is a dynamic signal for the programmable logic device and the set signal is a configuration signal for the programmable logic device.

5. The system of claim 4, wherein the programmable logic device comprises a field programmable gate array.

6. The system of claim 2, wherein the second input transmission gate is configured to receive a data input signal.

7. The system of claim 1, wherein the control circuit is configured to respond to an assertion of a sense enable signal while the input initialization signal is de-asserted by cycling the master clock and the slave clock responsive to the system clock.

8. The system of claim 7, wherein the control circuit includes a sense enable latch configured to latch the sense enable signal responsive to the system clock while the input initialization signal is de-asserted.

9. The system of claim 8, wherein the control circuit includes an internal clock node for receiving the system clock responsive to the sense enable latch latching the asserted sense enable signal.

10. The system of claim 9, wherein the control circuit includes an inverter for inverting a voltage on the internal clock node to produce the slave clock.

11. The system of claim 9, wherein the control circuit is configured to discharge the internal clock node responsive to an assertion of the input initialization signal while the asynchronous initialization signal is asserted.

12. The system of claim 1, wherein the control circuit includes a delay circuit configured so that the slave clock is asserted after an assertion of the input initialization signal.

13. The system of claim 9, further including a serial combination of a NAND gate and an inverter coupled to the internal clock node to produce the master clock.

14. A method, comprising:

in a register having a master latch in series with a slave latch, selecting for an initialization input to the master latch responsive to an assertion of a dual-mode initialization signal;

in a synchronous initialization mode of operation, asserting a master clock to open the master latch to receive the initialization input during one portion of a system clock period and asserting a slave clock to open the slave latch to receive the initialization input from the master latch during a remaining portion of the system clock period; and in an asynchronous initialization mode of operation, simultaneously asserting the master clock and the slave clock so that both the master latch and the slave latch open together to receive the initialization input.

15. The method of claim 14, further comprising selecting for a data input to the master latch responsive to a de-assertion of the dual-mode initialization signal.

16. The method of claim 15, further comprising: latching a sense enable signal to control a cycling of the master clock and the slave clock while the master latch receives the data input.

17. The method of claim 14, further comprising configuring the register during the configuration of a programmable logic device including the register.

18. A system comprising:

a register including a master latch in series with a slave latch, the master latch being configured to open responsive to an assertion of the master clock and the slave latch being configured to open responsive to an assertion of slave clock, the register further including a first transmission gate configured to select for an initialization signal responsive to an assertion of a dual-mode initialization signal to provide the initialization signal to the master latch;

means for driving the dual-mode initialization signal, the master clock, and the slave clock in a synchronous initialization mode so that the master latch latches the initialization signal while the master clock is asserted and the slave clock is de-asserted and so that the slave latch latches the initialization signal while the slave clock is asserted and the master clock is de-asserted; and means for driving the dual-mode initialization signal, the master clock, and the slave clock in an asynchronous initialization mode so that the master latch latches the initialization signal simultaneously with the slave latch.

19. The system of claim 18, wherein the register includes a second transmission gate for selecting for a data input to the master latch.

20. The system of claim 18, further comprising:

means for selecting between a dynamic preload signal and a set configuration signal for forming the initialization signal.

* * * * *